United States Patent [19]

Coleman et al.

[11] 4,031,312

[45] June 21, 1977

[54] WEATHERPROOF ENCLOSURE FOR ELECTRICAL WIRING DEVICES

[75] Inventors: Allan Coleman, Highland Park; Bernard Macklin, Rolling Meadows, both of Ill.

[73] Assignee: Electrical Conductors, Inc., North Chicago, Ill.

[22] Filed: Aug. 14, 1975

[21] Appl. No.: 604,539

[52] U.S. Cl. .................. 174/52 R; 174/135; 220/344; 339/44 R
[51] Int. Cl.² .................................... H05K 5/00
[58] Field of Search ............. 174/50, 52 R, 59, 60, 174/138 F, 92, 135; 339/36, 37, 39, 44 R, 44 M; 220/326, 344, 378; 217/57; 27/16, 17, DIG. 1; 206/269, 261

[56] References Cited

UNITED STATES PATENTS

| | | | |
|---|---|---|---|
| 1,989,527 | 1/1935 | Powers | 206/269 |
| 2,271,918 | 2/1942 | Glowka | 220/378 X |
| 2,656,946 | 10/1953 | Clarke | 220/378 X |

FOREIGN PATENTS OR APPLICATIONS

| | | | |
|---|---|---|---|
| 694,562 | 12/1930 | France | 174/60 |
| 1,063,674 | 8/1959 | Germany | 339/44 |
| 713,389 | 8/1954 | United Kingdom | 174/59 |

*Primary Examiner*—J. V. Truhe
*Assistant Examiner*—D. A. Tone
*Attorney, Agent, or Firm*—Irving Faber

[57] ABSTRACT

This invention relates to a new and useful apparatus for protecting electrical wiring devices from rain, snow and other exterior elements. The apparatus consists of a molded top cover and bottom housing coupled together by a spring-type hinge. The molded cover and housing has a slot or channel therein for receipt of a polyurethane gasket. The housing has provisions for receiving a wire channel with circuit breakers or a plurality of molded receptacles coupled to a cable. The spring hinge snaps the cover and housing together so that the polyurethane gaskets mattingly abut each other and simultaneously surround any cables passing therebetween in such a manner as to inhibit moisture or other outside elements from entering the enclosure.

11 Claims, 6 Drawing Figures

4,031,312

WEATHERPROOF ENCLOSURE FOR ELECTRICAL WIRING DEVICES

BACKGROUND OF INVENTION

This invention relates to a new and useful weatherproof enclosure for electrical wiring devices and in particular relates to a new type of weatherproof enclosure for inhibiting moisture and other outside elements from entering therein, when said device is used on a construction site or other similar type situations.

There are weatherproof enclosures for protecting electrical wiring devices. However, these enclosures are of a permanent nature and are not suitable for construction sites or the like. In general, when tradesmen at a construction site are going to use an electrical power tool or device such as a drill, extension light, etc., an extension cord is run from the power source to the area in which the power tool or device is to be used. The tool becomes operable when it is connected to the extension cord. If the construction area is dry, there is generally no problem with this arrangement. A problem occurs when the construction site is wet, which is more likely to be the case. In this situation if the receptacle end of the extension cord lies on the ground, moisture will enter the receptacle slots and when a power tool is connected thereto, the operator of the power tool will receive a severe shock and depending upon the particular circumstances, he can become electrocuted. There are times when the extension cords are left in the field overnight enabling moisture to accumulate within the receptacle slots.

The present weatherproof enclosures used in the field are only certified by Underwriters Laboratories as being for outdoor use while in use. This means that the weatherproof enclosure is only good when the outlet contained therein has a device connected to it. This is not the normal situation. In most instances a worker will connect a tool or other device to an extension cord, use it, and disconnect it, leaving the receptacle end of the cord lying in the field. This is where the problem lies. Once moisture enters the slots of the receptacle end of the extension cord, the next person attaching a power tool thereto can become his own executioner upon turning said power tool on. Also, another inherent problem with leaving the extension cord in the field, is if it rains, the receptacle end of the extension cord can short circuit the line or more important leak electricity into the puddle and cause severe shock to someone touching the water or walking through it.

There is a great need for protecting construction workers from the hazard of electrical shock and possible electrocution when extension cords lay in open areas, said cords being susceptable to accumulating moisture within the slots of the receptacle end thereof.

The present invention provides a portable weatherproof enclosure for housing the receptacle end of an extension cord which will inhibit the accumulation of moisture within the slots of the receptacle. The extension cord as well as the cord from the tool or device to be used is positioned between abutting polyurethane gaskets and connected together within the enclosure, the gaskets sealing the enclosure against entry of moisture therein.

SUMMARY OF INVENTION

This invention relates to a new and improved portable weatherproof enclosure for electrical wiring devices that inhibits moisture from entering a wiring device positioned in said enclosure. The wiring device can be in the nature of a wire channel having a plurality of circuit breakers connected thereto or it may be an extension cord having one or more receptacles. The wiring device may also consist of a plurality of circuit breakers in combination with ground fault interrupters.

The enclosure has an upper cover and lower housing coupled together by means of a spring-type hinge. The upper and lower elements each have a molded slot for receiving a polyurethane gasket. The gasket is such that it forms a seal around any cord positioned between the upper and lower elements; the gasket in the upper and lower elements mattingly abutting each other when the elements are in the closed position. The spring-type hinge keeps the upper and lower elements closed together; said elements being separated only by applying sufficient force against the spring-type hinge. The lower element or housing has a moisture hole positioned therein to enable any moisture forming within the enclosure due to condensation, etc., to exit the enclosure.

Accordingly, it is an object of this invention to provide a weatherproof enclosure for housing electrical wiring devices.

Another object of this invention is to provide a weatherproof enclosure for electrical wiring devices, said enclosure having a gasket positioned between its upper and lower elements.

Another object of this invention is to provide a weatherproof enclosure that can be used safely on a construction site and that inhibits moisture accumulation into the electrical wiring devices within the enclosure.

Still another object is to provide a weatherproof enclosure that inhibits moisture accumulation into electrical wiring devices within the enclosure.

BRIEF DESCRIPTION OF THE DRAWINGS

A preferred embodiment of this invention has been chosen for purposes of illustration and description, wherein.

DESCRIPTION OF PREFERRED EMBODIMENT

Figure 1:
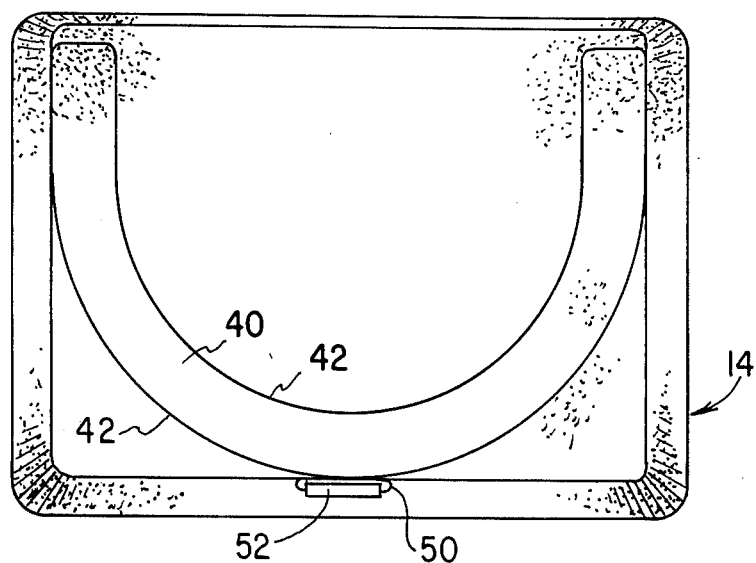
FIG. 1 is a top plan view showing the upper and lower elements in a closed position.

The preferred embodiment illustrated is not intended to be exhaustive or to limit the invention to the precise form disclosed. It is chosen and described in order to best explain the principles of the invention and its application and practical use to thereby enable others skilled in the art to best utilize the invention.

The illustrated embodiment of the weatherproof enclosure is designated by the reference numeral 10 having a housing or lower element 12 to which is coupled a cover or upper element 14 by means of a spring-type hinge 16.

Figure 4:
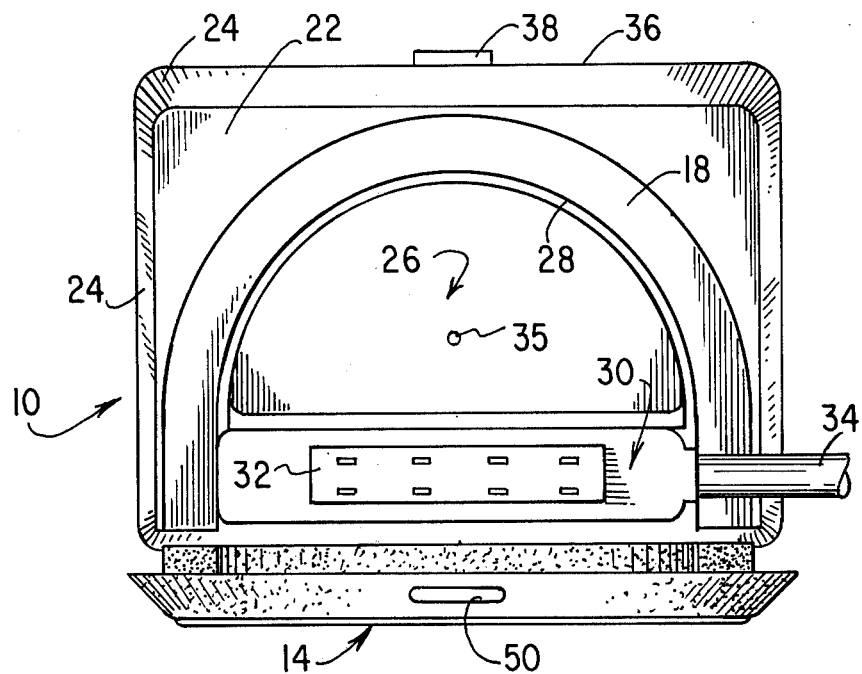
FIG. 4 is a top view with the upper and lower elements in an open position.
Figure 5:
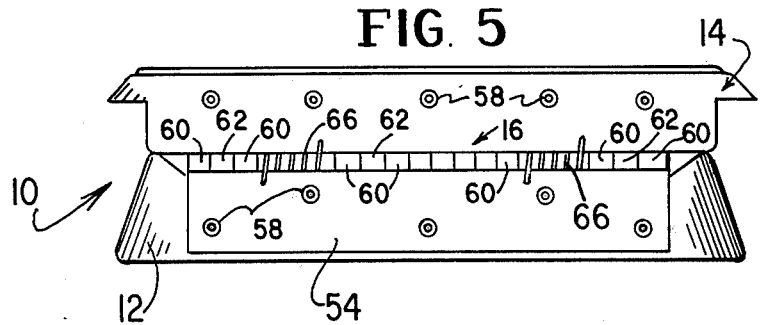
FIG. 5 is a rear view showing the upper and lower elements in a closed position and the spring-type hinge relative thereto.

The housing or lower element is best illustrated in FIG. 4 and is preferably molded of a composition plastic. A channel or slot 18 is provided for receiving a gasket 20. The slot 18, as illustrated, is of a semi-circular configuration; however, it is understood that it may have any geometrical configuration without departing from the spirit and scope of the invention.

The housing or lower element 12 comprises an outer wall 22 having a beveled side 24 with an interior well 26; the well having a ridge 28. The channel or slot 18 for receiving the gasket 30 is defined between the ridge 28 and the outer wall 22. The width of the channel 18 is suitable for receiving the gasket 20. The well 26 has provision for receiving a wiring device 30, said device consisting of four receptacles 32 molded to an extension cord 34. It is understood that the wiring device illustrated is one of many that can be used without departing from the spirit and scope of the invention. It is possible to position within the well 26, a wiring channel having circuit breakers or circuit breakers in combination with ground fault interrupters, said breakers not being illustrated. An aperture 35 is positioned within the well 26 enabling any moisture that may form by means of condensation or otherwise enter the enclosure to run out.

Figure 2:
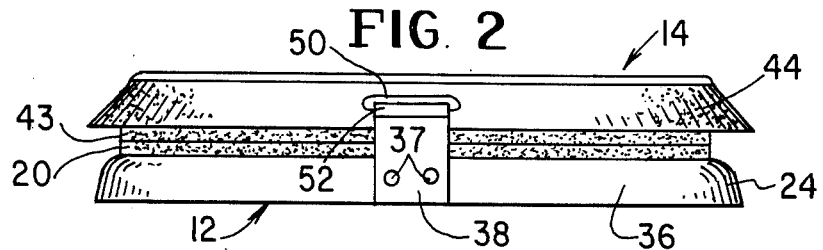
FIG. 2 is a front view showing the upper and lower elements in a closed position.
Figure 3:
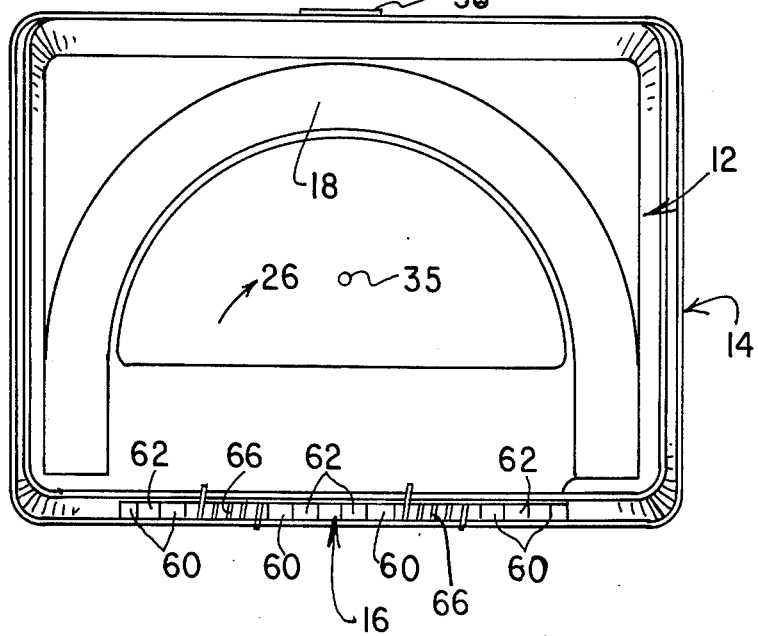
FIG. 3 is a bottom view of the invention showing the spring-type hinge between the upper and lower elements.

As illustrated in FIG. 2, the housing 12 has a front end 36 to which is attached by rivet type connectors 37 a spring latch 38, said latch securing the cover 14 to the housing 12. Means other than rivet type connectors may be used to attach the latch 38 to the cover 12 without departing from the spirit and scope of the invention.

Figure 6:
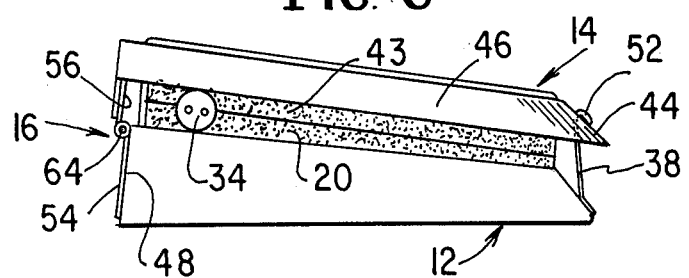
FIG. 6 is a side view of the invention.

The cover or upper element 14 is best illustrated in FIG. 1 and is molded from the same composition as the lower element and has formed therein a channel 40 of the same shape and configuration as the channel 18 of the housing 12. The channel 40 is defined by ridges 42 and is positioned in the cover so that it is juxtaposed upon the channel 18 when the cover 14 is in a closed position as best illustrated in FIG. 6. The ridges 42 are molded as part of the cover 14. A gasket 43 of the same type and configuration as the gasket 20 is positioned within channel 40. The gaskets 20 and 43 are affixed to their respective channels 18 and 40 by means well known in the art.

The cover 14 has beveled front side 44, beveled sides 46 and a rear side 48, said rear being higher than the beveled front and sides. A slot 50 is positioned in the front beveled side for receiving the spring latch 38; said spring latch having a knurled end 52 that is suitable for positioning within the slot 50 to hold the cover 14 in a closed position with the housing 12.

The spring-type butt hinge 16 is well known in the art and is designed to hold the upper and lower elements together until sufficient external force is applied against the spring to separate the cover from the housing; the elements returning to their normal closed position upon release of the applied external force. The return of the elements to their closed position is similar to a snapping action. The butt hinge 16 has two plates 54 and 56 attached to the housing 12 and cover 14 respectively by means of rivet type connectors 58. There are many other means, well known in the art, for attaching the hinge plates 52 and 54 to the housing and cover. The butt plates 54 and 56 each have a plurality of hollow nodules 60 and 62 respectively so that when the butt plates 54 and 56 are positioned together the hollow nodules form a conduit for receiving a pin 64. A pair of springs 66 are positioned adjacent the nodules enabling the pin 64 to pass therethrough. It is the springs 66 juxtaposed the nodules 56 and 58 that enable the cover to snap closed to the house when external force is used to separate the cover from the housing and to keep the upper and lower elements firmly closed together. The hinge illustrated and described herein is commonly known as a butt type hinge, however, it is understood that other hinges well known in the art may be used in lieu thereof without deviating from the spirit and scope of this invention.

The gaskets 20 and 43 are preferably made of polyurethane and are positioned into each of the channels 18 and 40 of the housing and cover and are affixed thereto by means well known in the art. The gasket for the housing and cover each extend approximately one inch above the respective surfaces of each element. The gaskets 20 and 43 are the same width as the channels 18 and 40. It is the polyurethane gasket 20 and 43 that inhibits moisture and other elements from entering into the enclosure 10.

In operation, the wiring device is positioned within the well 26 of the housing 22. As illustrated in FIGS. 4 and 6, the wiring device 30 has the cable 34 positioned between the gaskets for the housing 12 and cover 14, the gaskets sealing the cable 34 and inhibiting moisture from entering into the housing 12 around said cable. In the event someone desires to connect a power tool or other type of electrical device, the cover is opened which exposes the receptacles 32 or other type wiring channel not illustrated, and the device is plugged therein; after which, the cover snaps closed sealing the cable 34 and the cord for the electrical device between the gaskets. The cover is locked in place by means of the spring latch 38 engaging the slot 50. When the electrical device is not being used, it is disconnected from the wiring device and its cord is removed from the enclosure 10. The receptacles 32 or other wiring channel remains in the enclosure 10, sealed against moisture entering therein.

It is further understood that the polyurethane gaskets 20 and 43 will be of the same configuration as the channels 18 and 40. Therefore, a circular channel will have a circular gasket. It is further understood that the gaskets 20 and 43 may be of a composition other than polyurethane without departing from the spirit and scope of this invention. There are many compositions, known in the art, that are as suitable to use as polyurethane.

It is believed that the invention has been described in such detail as to enable those skilled in the art to understand the same, and it will be appreciated that variations or modifications may be made without departing from the spirit and scope of the invention.

What is desired to secure by letters patent in the United States is:

1. A portable weatherproof enclosure comprising:
  a housing;
  a cover;
  a spring-type hinge coupling the housing and the cover together enabling said cover to open and close upon said housing;
  a gasket affixed to each of the housing and cover, wherein the gaskets are positioned within the housing and cover so that they will matingly abut each other when the cover and housing are in a closed position; and a wiring device positioned within the housing, said wiring device being molded to an extension cord, and said extension cord passing between the gaskets of the cover and the housing.

2. A portable weatherproof enclosure as defined in claim 1 wherein said housing has positioned therein a channel receiving the housing gasket.

3. A portable weatherproof enclosure as defined in claim 2 wherein said cover has positioned therein a channel receiving the cover gasket.

4. A portable weatherproof enclosure as defined in claim 3 wherein said enclosure further comprises:
a spring latch coupled to the housing; and
means positioned in the cover for receiving the latch.

5. A portable weatherproof enclosure as defined in claim 4 wherein the said enclosure further comprises drainage means positioned in the housing for drainage of any moisture accumulating in said housing.

6. A portable weatherproof enclosure as defined in claim 5 wherein said wiring device is a receptacle.

7. A portable weatherproof enclosure as defined in claim 6 wherein said cover has beveled front and side edges, said beveled sides facilitating the run off of rain and snow.

8. A portable weatherproof enclosure as defined in claim 7 wherein the spring-type hinge is a butt hinge having a pair of butt plates, said plates each having a plurality of hollow nodules for receiving a pin therethrough.

9. A portable weatherproof enclosure as defined in claim 8 wherein said hinge further comprises a pair of springs for positioning between a pair of hollow nodules, said springs having provision for receiving the pin; the hollow nodules of each butt plate and the spring forming a conduit for receiving the pin when the butt plates are coupled together.

10. A portable weatherproof enclosure as defined in claim 5 wherein said wiring device is a receptacle.

11. A portable weatherproof enclosure for housing an electrical wiring device, comprising:
a housing;
a cover;
a spring-type hinge coupling the housing and the cover together enabling said cover to open and close upon said housing;
a gasket affixed to each of the housing and cover, wherein the gaskets are positioned within the housing and cover so that they will matingly abut each other when the cover and housing are in a closed position; and
an extension cord having a receptacle molded thereto, said cord passing between the gaskets of the cover and the housing.

* * * * *

UNITED STATES PATENT OFFICE
CERTIFICATE OF CORRECTION

Patent No. 4,031,312            Dated June 21, 1977

Inventor(s) Allan Coleman et al.

It is certified that error appears in the above-identified patent and that said Letters Patent are hereby corrected as shown below:

Column 3, line 47, "said rear being higher" should read

-- said rear side being higher --.

Signed and Sealed this

First Day of November 1977

[SEAL]

Attest:

RUTH C. MASON  
*Attesting Officer*

LUTRELLE F. PARKER  
*Acting Commissioner of Patents and Trademarks*

UNITED STATES PATENT OFFICE
CERTIFICATE OF CORRECTION

Patent No. 4,031,312                             Dated  June 21, 1977

Inventor(s)  Allan Coleman et al.

It is certified that error appears in the above-identified patent and that said Letters Patent are hereby corrected as shown below:

Column 6, line 10, (claim 10) - "A portable weatherproof enclosure as defined in claim 5 wherein said wiring device is a receptacle." should read --A portable weatherproof enclosure as defined in claim 5 wherein said wiring device is a wiring channel having circuit breakers coupled thereto.--

*Signed and Sealed this*

*Second* Day of *May 1978*

[SEAL]

Attest:

RUTH C. MASON
*Attesting Officer*

LUTRELLE F. PARKER
*Acting Commissioner of Patents and Trademarks*